(12) United States Patent
Greenlee et al.

(10) Patent No.: US 11,742,282 B2
(45) Date of Patent: Aug. 29, 2023

(54) CONDUCTIVE INTERCONNECTS

(71) Applicant: Micron Technology, Inc., Boise, ID (US)

(72) Inventors: Jordan D. Greenlee, Boise, ID (US); Rita J. Klein, Boise, ID (US); Everett A. McTeer, Eagle, ID (US); John D. Hopkins, Meridian, ID (US); Shuangqiang Luo, Boise, ID (US); Song Kai Tan, Singapore (SG); Jing Wai Fong, Singapore (SG); Anurag Jindal, Singapore (SG); Chieh Hsien Quek, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/988,422

(22) Filed: Aug. 7, 2020

(65) Prior Publication Data
US 2022/0044999 A1 Feb. 10, 2022

(51) Int. Cl.
*H01L 23/522* (2006.01)
*H01L 21/768* (2006.01)
*H10B 43/27* (2023.01)
*H01L 23/532* (2006.01)

(52) U.S. Cl.
CPC .... *H01L 23/5226* (2013.01); *H01L 21/76843* (2013.01); *H01L 21/76847* (2013.01); *H01L 21/76877* (2013.01); *H10B 43/27* (2023.02); *H01L 23/53209* (2013.01); *H01L 23/53266* (2013.01)

(58) Field of Classification Search
CPC ..... H01L 2924/00014; H01L 2924/014; H01L 2224/73204; H01L 2224/32225; H01L 2924/0105
See application file for complete search history.

(56) References Cited

U.S. PATENT DOCUMENTS

| | | | |
|---|---|---|---|
| 9,051,641 B2* | 6/2015 | Lu | H01L 21/76871 |
| 2003/0062626 A1 | 4/2003 | Bhowmik et al. | |
| 2005/0023702 A1 | 2/2005 | Nishimura et al. | |
| 2012/0252207 A1 | 10/2012 | Lei et al. | |
| 2014/0021633 A1 | 1/2014 | Lee et al. | |
| 2018/0358379 A1 | 12/2018 | Han et al. | |
| 2020/0194446 A1* | 6/2020 | Nishida | H01L 29/1037 |
| 2020/0395304 A1* | 12/2020 | Chen | H01L 23/49894 |

FOREIGN PATENT DOCUMENTS

WO PCT/US2021/043441 11/2021
WO PCT/US2021/043441 2/2023

* cited by examiner

*Primary Examiner* — Tony Tran
(74) *Attorney, Agent, or Firm* — Wells St. John P.S.

(57) ABSTRACT

Some embodiments include conductive interconnects which include the first and second conductive materials, and which extend upwardly from a conductive structure. Some embodiments include integrated assemblies having conductive interconnects.

15 Claims, 10 Drawing Sheets

CONDUCTIVE INTERCONNECTS

TECHNICAL FIELD

Integrated assemblies (e.g., integrated memory). Methods of forming integrated assemblies. Conductive interconnect structures. Methods of forming conductive interconnect structures.

BACKGROUND

Memory provides data storage for electronic systems. Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of flash memory and may be configured to comprise vertically-stacked memory cells.

Before describing NAND specifically, it may be helpful to more generally describe the relationship of a memory array within an integrated arrangement. FIG. 1 shows a block diagram of a prior art device 1000 which includes a memory array 1002 having a plurality of memory cells 1003 arranged in rows and columns along with access lines 1004 (e.g., wordlines to conduct signals WL0 through WLm) and first data lines 1006 (e.g., bitlines to conduct signals BL0 through BLn). Access lines 1004 and first data lines 1006 may be used to transfer information to and from the memory cells 1003. A row decoder 1007 and a column decoder 1008 decode address signals A0 through AX on address lines 1009 to determine which ones of the memory cells 1003 are to be accessed. A sense amplifier circuit 1015 operates to determine the values of information read from the memory cells 1003. An I/O circuit 1017 transfers values of information between the memory array 1002 and input/output (I/O) lines 1005. Signals DQ0 through DQN on the I/O lines 1005 can represent values of information read from or to be written into the memory cells 1003. Other devices can communicate with the device 1000 through the I/O lines 1005, the address lines 1009, or the control lines 1020. A memory control unit 1018 is used to control memory operations to be performed on the memory cells 1003, and utilizes signals on the control lines 1020. The device 1000 can receive supply voltage signals Vcc and Vss on a first supply line 1030 and a second supply line 1032, respectively. The device 1000 includes a select circuit 1040 and an input/output (I/O) circuit 1017. The select circuit 1040 can respond, via the I/O circuit 1017, to signals CSEL1 through CSELn to select signals on the first data lines 1006 and the second data lines 1013 that can represent the values of information to be read from or to be programmed into the memory cells 1003. The column decoder 1008 can selectively activate the CSEL1 through CSELn signals based on the A0 through AX address signals on the address lines 1009. The select circuit 1040 can select the signals on the first data lines 1006 and the second data lines 1013 to provide communication between the memory array 1002 and the I/O circuit 1017 during read and programming operations.

The memory array 1002 of FIG. 1 may be a NAND memory array, and FIG. 2 shows a block diagram of a three-dimensional NAND memory device 200 which may be utilized for the memory array 1002 of FIG. 1. The device 200 comprises a plurality of strings of charge-storage devices. In a first direction (Z-Z'), each string of charge-storage devices may comprise, for example, thirty-two charge-storage devices stacked over one another with each charge-storage device corresponding to one of, for example, thirty-two tiers (e.g., Tier0-Tier31). The charge-storage devices of a respective string may share a common channel region, such as one formed in a respective pillar of semiconductor material (e.g., polysilicon) about which the string of charge-storage devices is formed. In a second direction (X-X'), each first group of, for example, sixteen first groups of the plurality of strings may comprise, for example, eight strings sharing a plurality (e.g., thirty-two) of access lines (i.e., "global control gate (CG) lines", also known as wordlines, WLs). Each of the access lines may couple the charge-storage devices within a tier. The charge-storage devices coupled by the same access line (and thus corresponding to the same tier) may be logically grouped into, for example, two pages, such as P0/P32, P1/P33, P2/P34 and so on, when each charge-storage device comprises a cell capable of storing two bits of information. In a third direction (Y-Y'), each second group of, for example, eight second groups of the plurality of strings, may comprise sixteen strings coupled by a corresponding one of eight data lines. The size of a memory block may comprise 1,024 pages and total about 16 MB (e.g., 16 WLs×32 tiers×2 bits=1,024 pages/block, block size=1,024 pages×16 KB/page=16 MB). The number of the strings, tiers, access lines, data lines, first groups, second groups and/or pages may be greater or smaller than those shown in FIG. 2.

FIG. 3 shows a cross-sectional view of a memory block 300 of the 3D NAND memory device 200 of FIG. 2 in an X-X' direction, including fifteen strings of charge-storage devices in one of the sixteen first groups of strings described with respect to FIG. 2. The plurality of strings of the memory block 300 may be grouped into a plurality of subsets 310, 320, 330 (e.g., tile columns), such as tile column$_I$, tile column$_J$ and tile column$_K$, with each subset (e.g., tile column) comprising a "partial block" of the memory block 300. A global drain-side select gate (SGD) line 340 may be coupled to the SGDs of the plurality of strings. For example, the global SGD line 340 may be coupled to a plurality (e.g., three) of sub-SGD lines 342, 344, 346 with each sub-SGD line corresponding to a respective subset (e.g., tile column), via a corresponding one of a plurality (e.g., three) of sub-SGD drivers 332, 334, 336. Each of the sub-SGD drivers 332, 334, 336 may concurrently couple or cut off the SGDs of the strings of a corresponding partial block (e.g., tile column) independently of those of other partial blocks. A global source-side select gate (SGS) line 360 may be coupled to the SGSs of the plurality of strings. For example, the global SGS line 360 may be coupled to a plurality of sub-SGS lines 362, 364, 366 with each sub-SGS line corresponding to the respective subset (e.g., tile column), via a corresponding one of a plurality of sub-SGS drivers 322, 324, 326. Each of the sub-SGS drivers 322, 324, 326 may concurrently couple or cut off the SGSs of the strings of a corresponding partial block (e.g., tile column) independently of those of other partial blocks. A global access line (e.g., a global CG line) 350 may couple the charge-storage devices corresponding to the respective tier of each of the plurality of strings. Each global CG line (e.g., the global CG line 350) may be coupled to a plurality of sub-access lines (e.g., sub-CG lines) 352, 354, 356 via a corresponding one of a plurality of sub-string drivers 312, 314 and 316. Each of the sub-string drivers may concurrently couple or cut off the charge-storage devices corresponding to the respective partial block and/or tier independently of those of other partial blocks and/or other tiers. The charge-storage devices corresponding to the respective subset (e.g., partial block) and the respective tier may comprise a "partial tier" (e.g., a single "tile") of charge-storage devices. The strings corresponding to the respective subset (e.g., partial block) may be coupled to a corresponding one of sub-sources 372, 374 and 376 (e.g., "tile source") with each sub-source being coupled to a respective power source.

The NAND memory device 200 is alternatively described with reference to a schematic illustration of FIG. 4.

The memory array 200 includes wordlines $202_1$ to $202_N$, and bitlines $228_1$ to $228_M$.

The memory array 200 also includes NAND strings $206_1$ to $206_M$. Each NAND string includes charge-storage transistors $208_1$ to $208_N$. The charge-storage transistors may use floating gate material (e.g., polysilicon) to store charge, or may use charge-trapping material (such as, for example, silicon nitride, metallic nanodots, etc.) to store charge.

The charge-storage transistors 208 are located at intersections of wordlines 202 and strings 206. The charge-storage transistors 208 represent non-volatile memory cells for storage of data. The charge-storage transistors 208 of each NAND string 206 are connected in series source-to-drain between a source-select device (e.g., source-side select gate, SGS) 210 and a drain-select device (e.g., drain-side select gate, SGD) 212. Each source-select device 210 is located at an intersection of a string 206 and a source-select line 214, while each drain-select device 212 is located at an intersection of a string 206 and a drain-select line 215. The select devices 210 and 212 may be any suitable access devices, and are generically illustrated with boxes in FIG. 4.

A source of each source-select device 210 is connected to a common source line 216. The drain of each source-select device 210 is connected to the source of the first charge-storage transistor 208 of the corresponding NAND string 206. For example, the drain of source-select device $210_1$ is connected to the source of charge-storage transistor $208_1$ of the corresponding NAND string $206_1$. The source-select devices 210 are connected to source-select line 214.

The drain of each drain-select device 212 is connected to a bitline (i.e., digit line) 228 at a drain contact. For example, the drain of drain-select device $212_1$ is connected to the bitline $228_1$. The source of each drain-select device 212 is connected to the drain of the last charge-storage transistor 208 of the corresponding NAND string 206. For example, the source of drain-select device $212_1$ is connected to the drain of charge-storage transistor $208_N$ of the corresponding NAND string $206_1$.

The charge-storage transistors 208 include a source 230, a drain 232, a charge-storage region 234, and a control gate 236. The charge-storage transistors 208 have their control gates 236 coupled to a wordline 202. A column of the charge-storage transistors 208 are those transistors within a NAND string 206 coupled to a given bitline 228. A row of the charge-storage transistors 208 are those transistors commonly coupled to a given wordline 202.

It is desired to develop improved NAND architecture and improved methods for fabricating NAND architecture.

Conductive interconnects may be utilized in NAND architecture and in other integrated assemblies. It is desired to develop improved conductive interconnects and improved methods of forming conductive interconnects.

DETAILED DESCRIPTION OF THE ILLUSTRATED EMBODIMENTS

Some embodiments include methods of forming conductive interconnects, such as, for example, conductive interconnects utilized within NAND memory assemblies. Some embodiments include integrated assembles (e.g., integrated memory). Example embodiments are described with reference to FIGS. 5-17.

Figure 5:
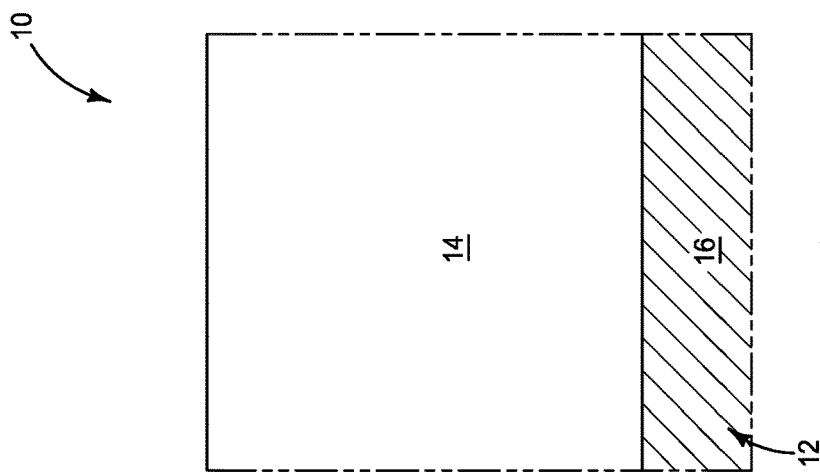

Referring to FIG. 5, an integrated assembly 10 includes an insulative material 14 over a conductive structure 12.

The insulative material 14 may comprise any suitable composition(s). For instance, in some embodiments the insulative material 14 may comprise one or more of silicon dioxide, silicon nitride, aluminum oxide, hafnium oxide, zirconium oxide, etc.

The conductive structure 12 comprises conductive material 16. The conductive material 16 may include any suitable electrically conductive composition(s); such as, for example, one or more of various metals (e.g., titanium (Ti), tungsten (W), cobalt (Co), nickel (Ni), platinum (Pt), ruthenium (Ru), etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive material 16 may comprise metal. For instance, the conductive material 16 may comprise, consist essentially of, or consist of one or more of tungsten, cobalt, nickel, WSi, CoSi, NiSi, etc., where the chemical formulas indicate primary constituents rather than specific stoichiometries.

Figure 6:
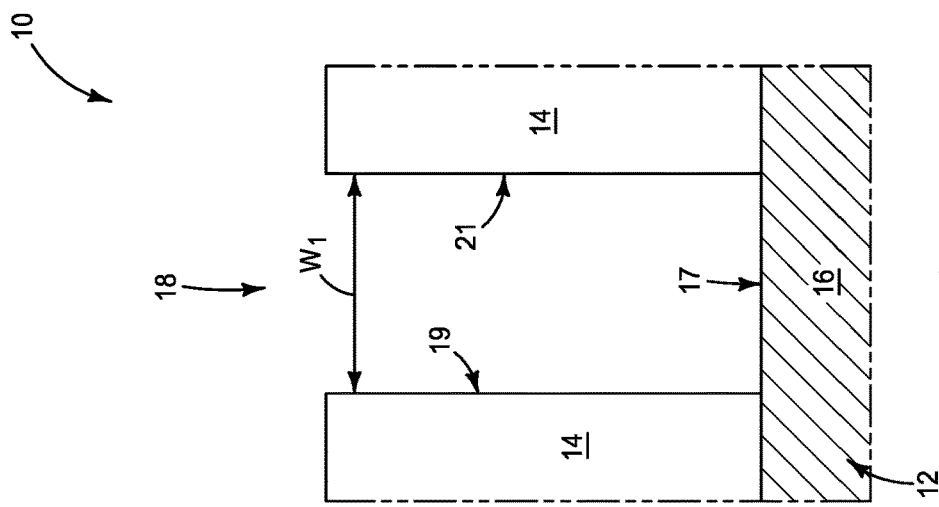

Referring to FIG. 6, an opening 18 is formed to extend through the insulative material 14 to the conductive structure 12. In the illustrated embodiment, the opening 18 stops at an upper surface of the conductive material 16 of the conductive structure 12. In other embodiments, the opening 18 may penetrate into the conductive material 16.

The opening 18 may have any suitable shape when viewed from above, including, for example, a circular shape, an elliptical shape, a polygonal shape, etc. The opening 18 has a pair of opposing sidewall peripheries 19 and 21 along the cross-sectional view of FIG. 6. Such sidewall peripheries are along the insulative material 14 in the illustrated embodiment. If the opening penetrates into the conductive material 16, lower regions of the sidewall peripheries 19 and 21 may be along the conductive material 16. The opening 18 also has a bottom periphery 17 which extends between the sidewall peripheries 19 and 21, and which is along the conductive structure 12.

The opening 18 may have any suitable dimension. In some embodiments, the opening 18 may have a width $W_1$ within a range of from about 100 nanometers (nm) to about 1000 nm, within a range of from about 400 nm to about 500 nm, etc.

Figure 1:
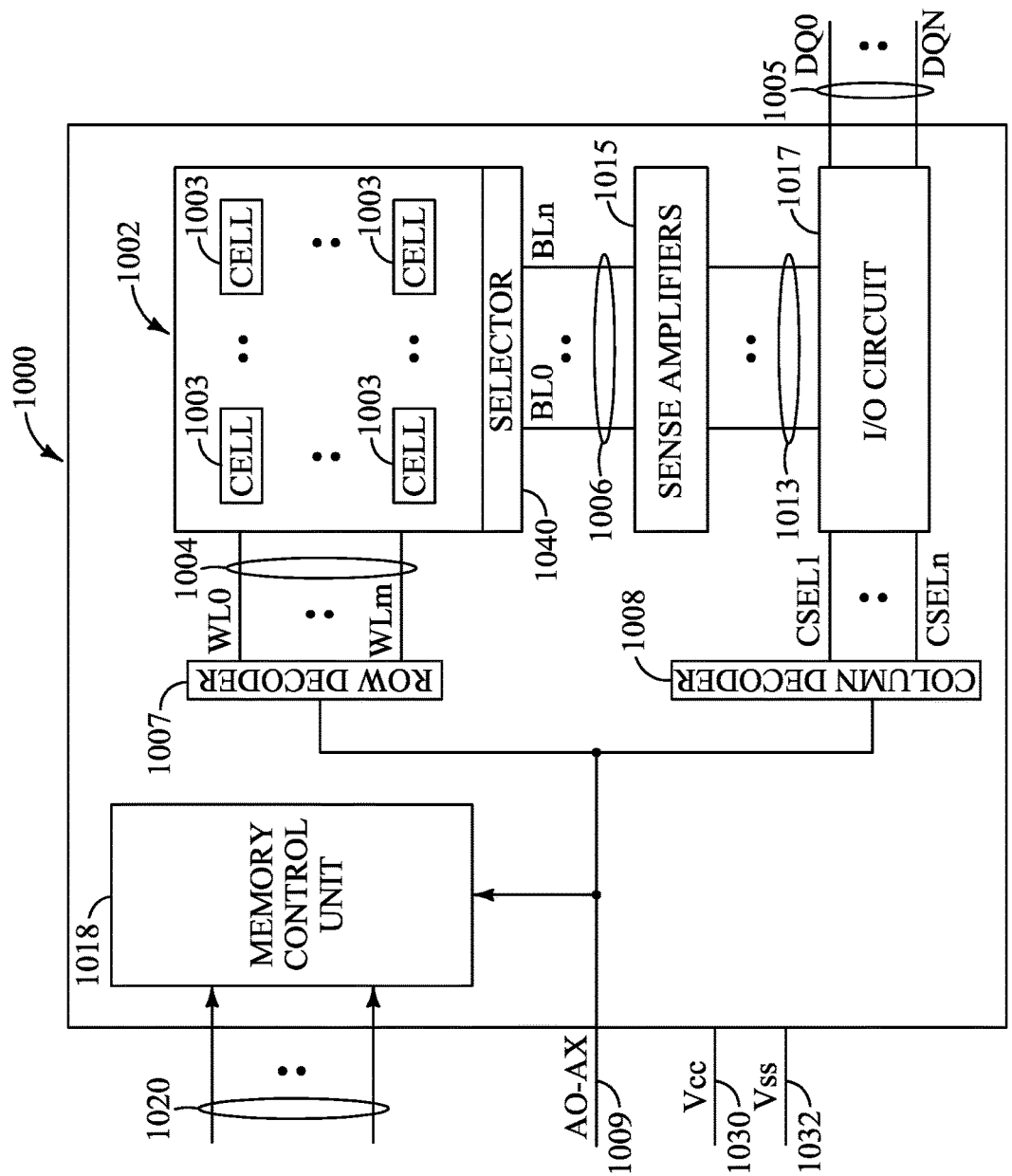
FIG. 1 shows a block diagram of a prior art memory device having a memory array with memory cells.
Figure 2:
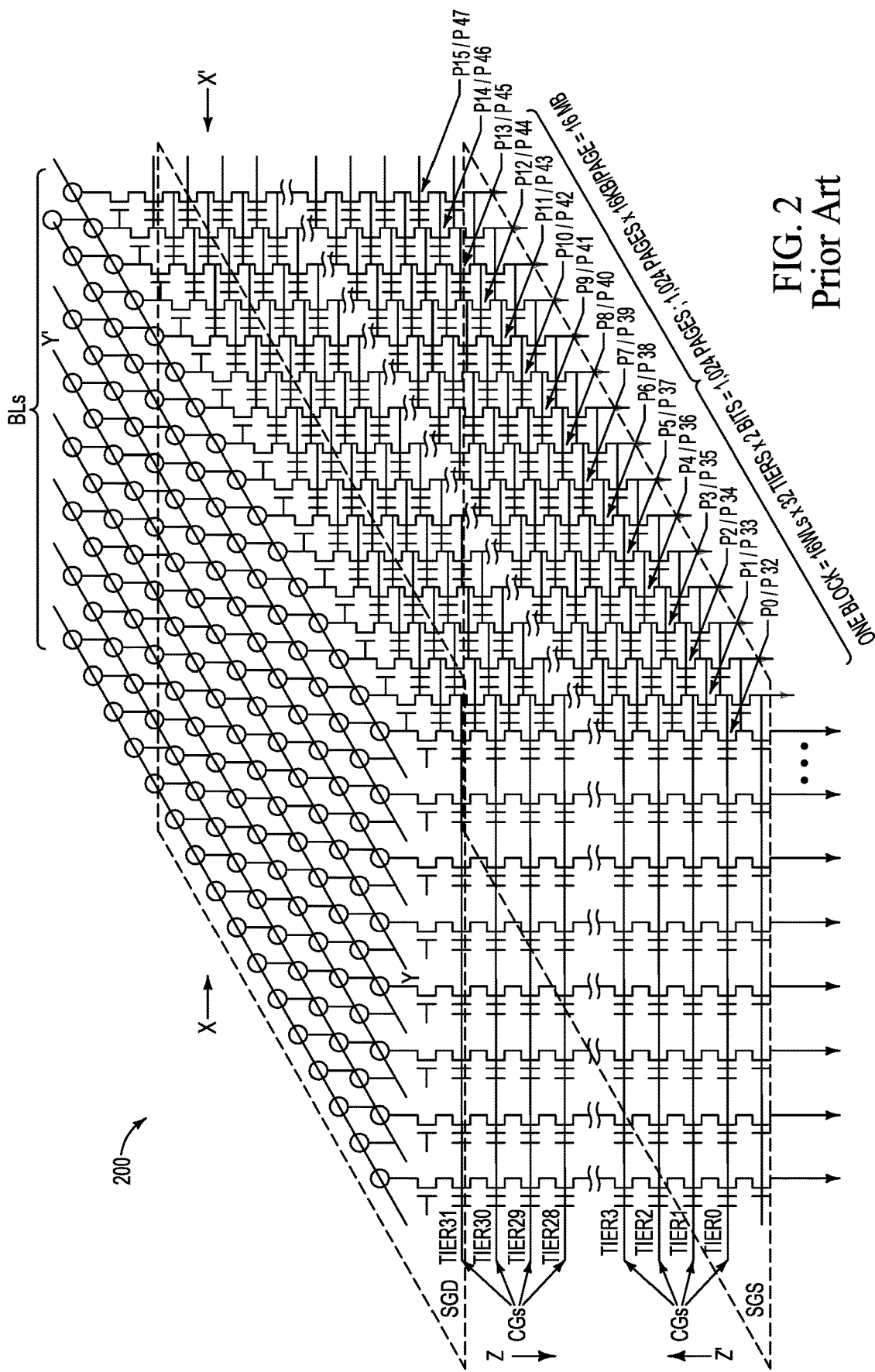
FIG. 2 shows a schematic diagram of the prior art memory array of FIG. 1 in the form of a 3D NAND memory device.
Figure 3:
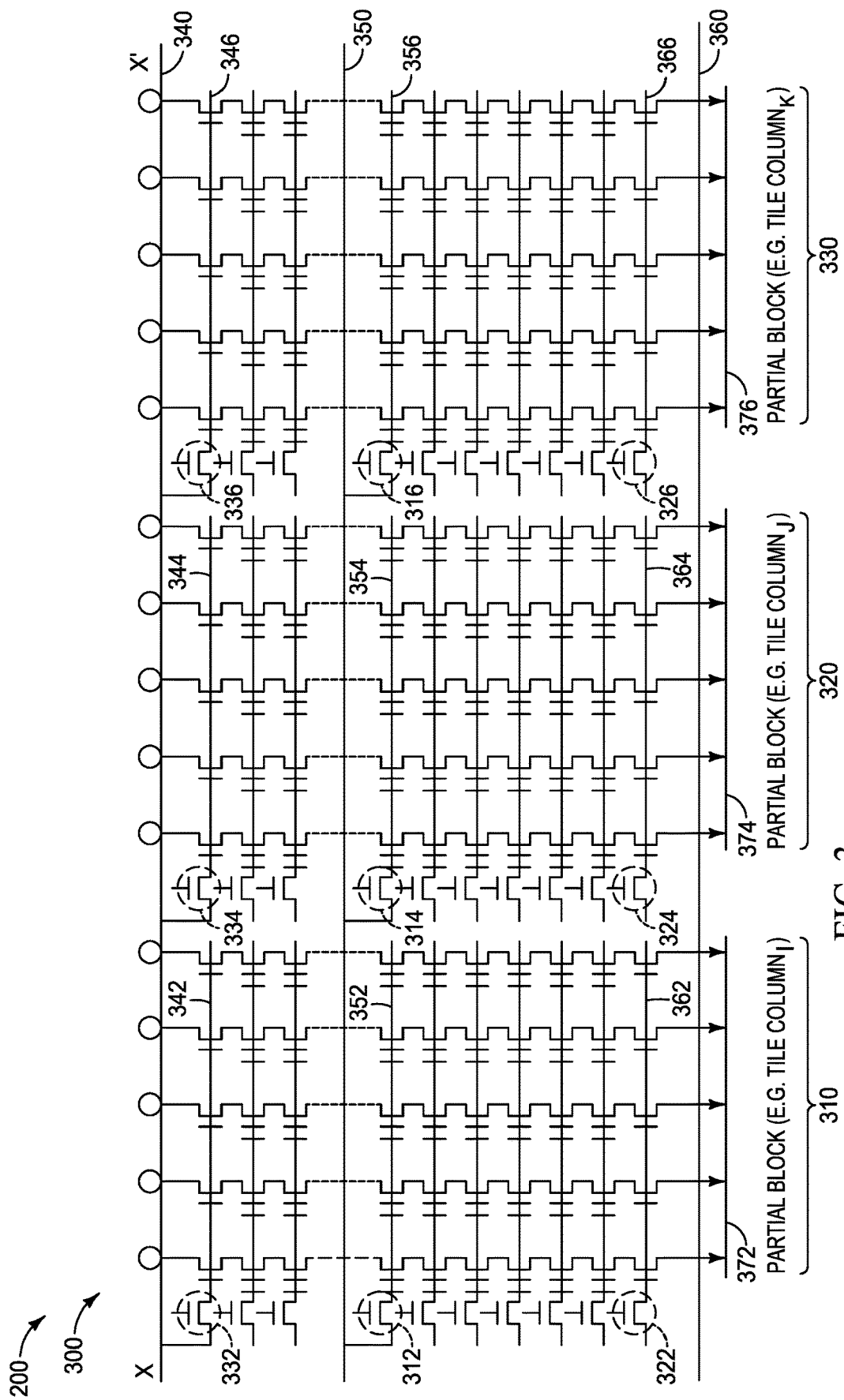
FIG. 3 shows a cross-sectional view of the prior art 3D NAND memory device of FIG. 2 in an X-X' direction.
Figure 4:
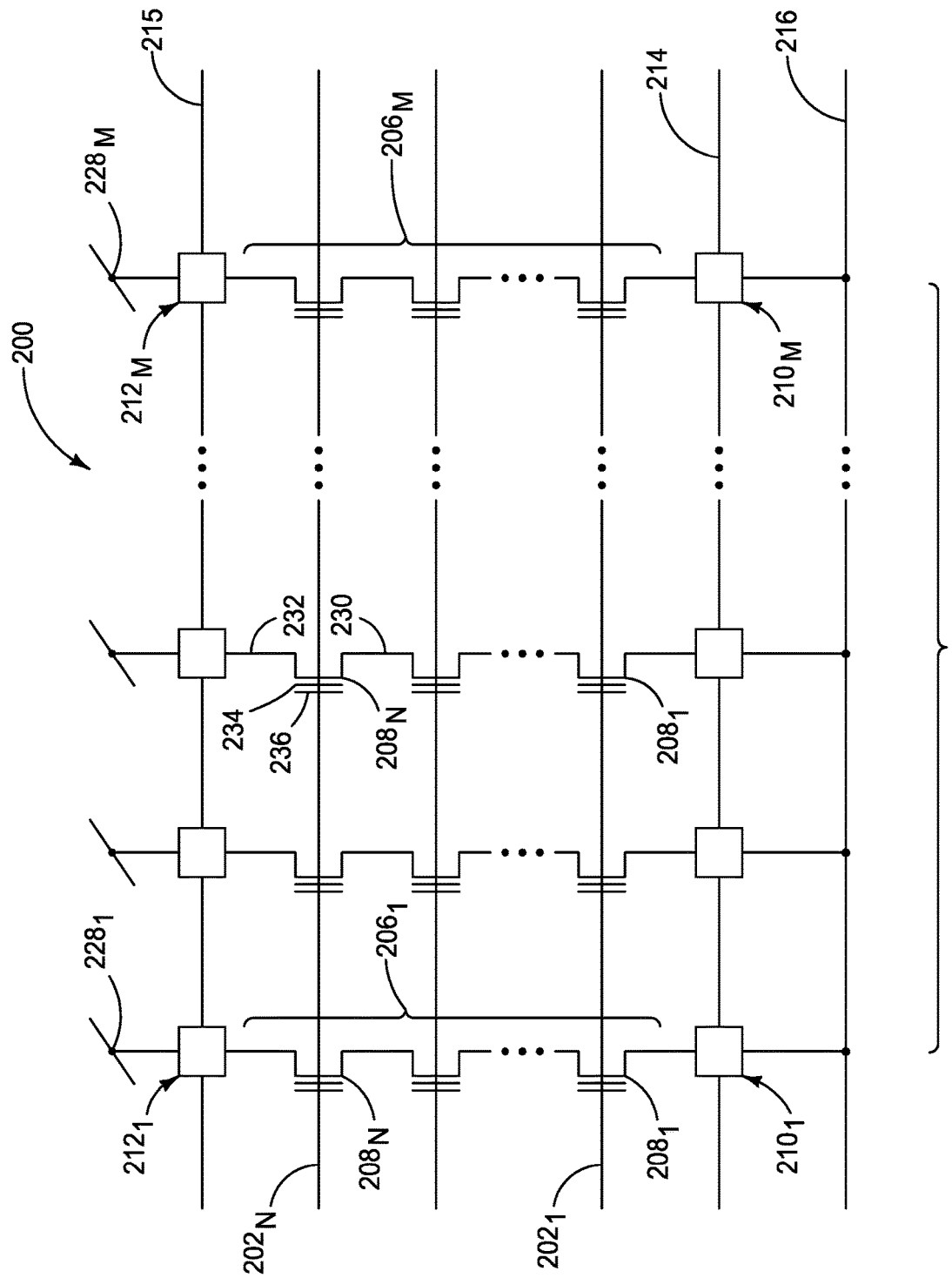
FIG. 4 is a schematic diagram of a prior art NAND memory array.
Figure 7:
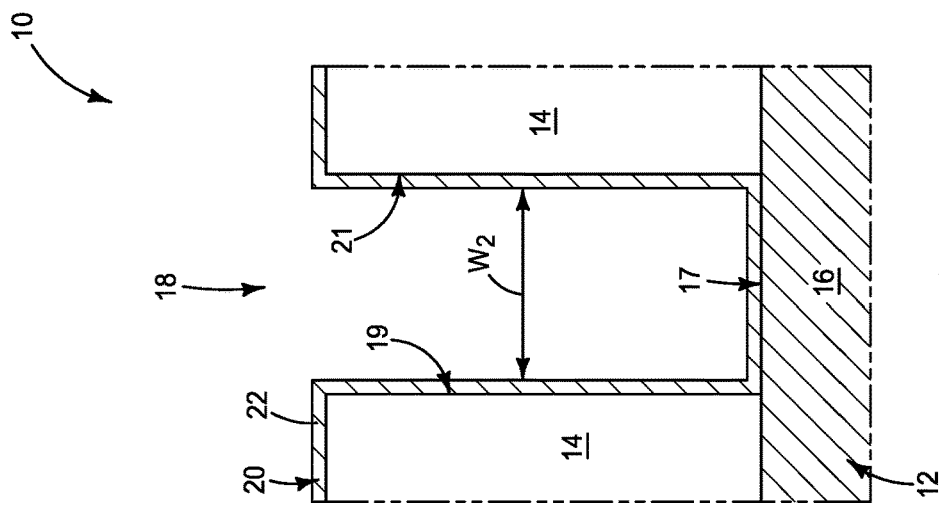
FIGS. 5-10 are diagrammatic cross-sectional side views of a region of an integrated assembly shown at sequential example process stages of an example method of forming an example structure.

Referring to FIG. 7, a liner 20 is formed along the sidewall peripheries 19 and 21, and along the bottom periphery 17. The liner 20 may be considered to line the opening 18.

The liner 20 comprises a liner material 22. The liner material 22 may be electrically conductive in some embodiments. The conductive liner material 22 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). For instance, the liner material 22 may comprise, consist essentially of, or consist of one or more metals (e.g., one or more of titanium, nickel and cobalt). In some embodiments, the liner material 22 may comprise, consist essentially of, or consist of one or more of metal silicide, metal germanide, metal oxide, metal nitride, metal boride and metal carbide. In some embodiments, the liner material 22 may comprise, consist essentially of, or consist of titanium nitride.

The liner 20 may have any suitable thickness, and in some embodiments may have a thickness which is less than or equal to about 10% of the width $W_1$ of the opening 18.

The liner 20 is optional, and may be omitted in some embodiments.

The lined opening 18 may have any suitable dimension. In some embodiments, the lined opening 18 may have a width $W_2$ within a range of from about 100 nm to about 1000 nm, within a range of from about 400 nm to about 500 nm, etc.

Figure 8:
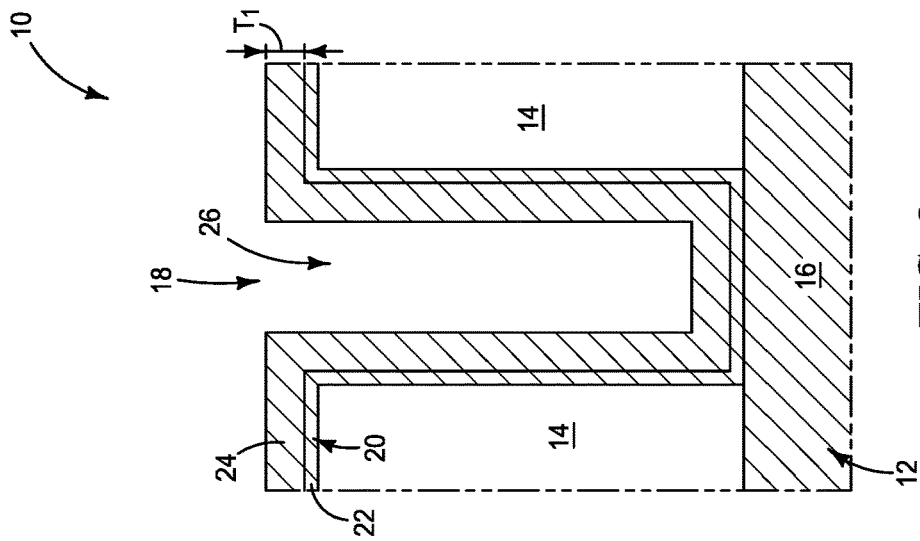

Referring to FIG. 8, a first conductive material 24 is formed within the opening 18 with atomic layer deposition (ALD) or any other suitable deposition method. The conductive material 24 may comprise any suitable electrically conductive composition(s); such as, for example, one or more of various metals (e.g., titanium, tungsten, cobalt, nickel, platinum, ruthenium, etc.) and/or metal-containing compositions (e.g., metal silicide, metal nitride, metal carbide, etc.).

In some embodiments, the first conductive material 24 may comprise tungsten, and the ALD may utilize reactants which include tungsten halide and hydrogen. The tungsten halide may comprise tungsten in combination with fluorine (e.g., may comprise $WF_6$).

The first conductive material 24 narrows the opening 18. A cavity 26 remains within the narrowed opening.

The liner 20, if present, may be utilized to improve adhesion between the material 24 and one or both of the materials 14 and 16, and/or may be utilized as a seed layer for the growth of the material 24.

The first conductive material 24 may have any suitable thickness $T_1$, and in some embodiments may have a thickness which is within a range of from about 2% to about 90% of the width $W_2$ of the lined opening 18 (with such width being shown in FIG. 7), within a range of from about 2% to about 40% of the width $W_2$ of the lined opening 18, etc.

Figure 9:
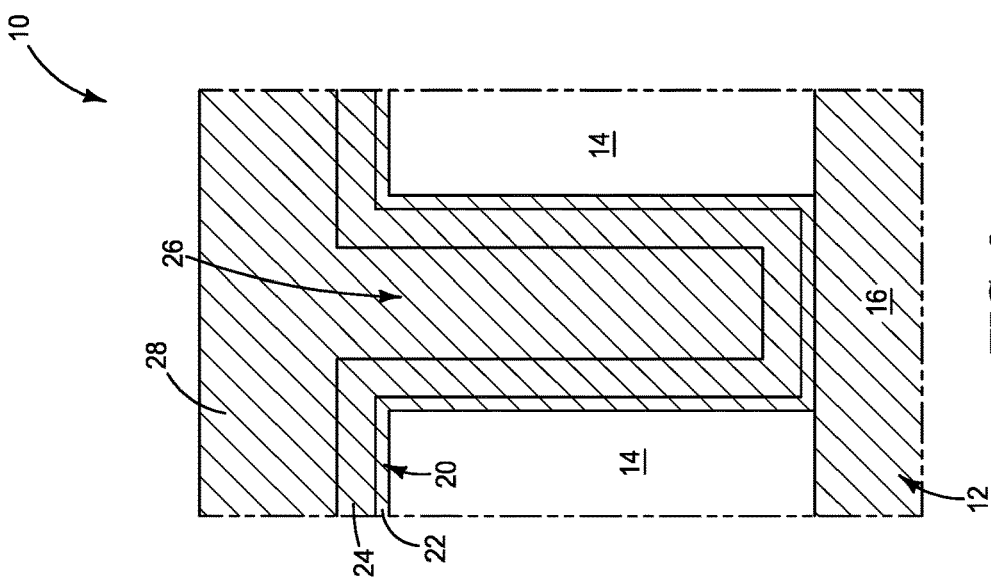

Referring to FIG. 9, a second conductive material 28 is formed within the cavity 26. The second conductive material 28 is formed with any suitable deposition method, and in some embodiments is formed with a deposition method other than ALD. For instance, the second conductive material 28 may be formed utilizing one or both of chemical vapor deposition (CVD) and physical vapor deposition (PVD).

The second conductive material 28 may comprise any suitable electrically conductive composition(s); such as, for example, one or more of various metals (e.g., titanium, tungsten, cobalt, nickel, platinum, ruthenium, etc.) and/or metal-containing compositions (e.g., metal silicide, metal nitride, metal carbide, etc.). In some embodiments, the first and second conductive materials 24 and 28 comprise a same metal as one another. For instance, the first and second conductive materials 24 and 28 may both comprise, consist essentially of, or consist of one or more of tungsten, cobalt and nickel.

In some embodiments, the second conductive material 28 may comprise tungsten, and may be deposited utilizing CVD with the same reactants described above as being suitable for the ALD of the tungsten (e.g., $WF_6$ and hydrogen). The difference between the CVD and the ALD is that the reactants are together at the same time in a reaction chamber during the CVD process, and are provided in the reaction chamber sequentially (i.e., substantially not at the same time) during the ALD process.

An advantage of the ALD may be that such may be utilized to form the metal-containing material 24 (e.g., tungsten) with low tensile stress (and possibly even with compressive stress) to at least partially offset a tensile stress which may be induced by the liner 20 and/or by other materials of the assembly 10 which are not shown in FIGS. 5-9. A disadvantage of the ALD may be that such is relatively slow (at least as compared to CVD and/or PVD), and also relatively expensive (at least as compared to CVD and/or PVD). The advantage of the CVD and/or PVD is the speed and the cost, but a disadvantage may be that the conductive material 28 has higher tensile stress than does the material 24 formed utilizing ALD. Thus, the relative amount of the conductive materials 24 and 28 may be tailored to achieve a balance between speed/cost and stress characteristics.

Figure 10:
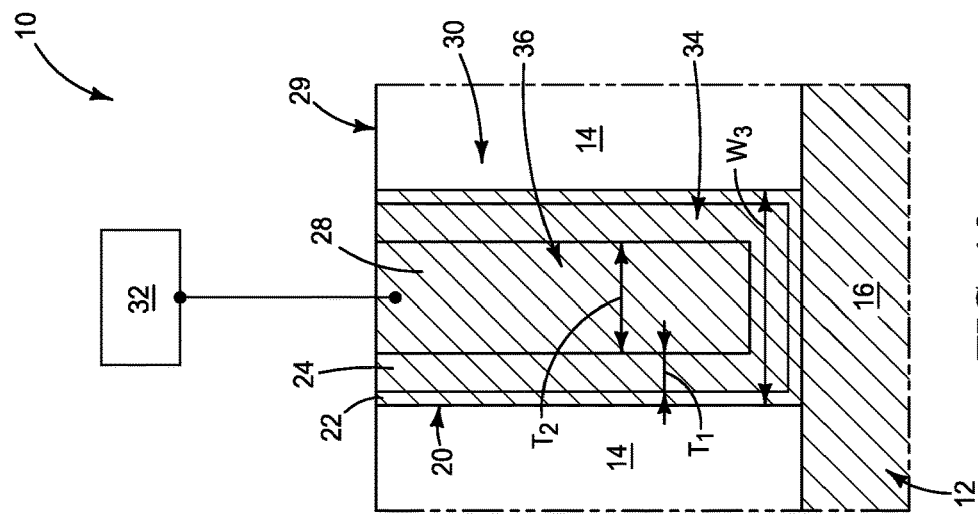

Referring to FIG. 10, the assembly 10 is subjected to planarization (e.g., chemical-mechanical polishing, CMP) to form a planarized surface 29 extending across the materials 14, 22, 24 and 28. A conductive interconnect 30 comprises the first and second conductive materials 24 and 28, and in the shown embodiment also comprises the optional conductive liner 20. The conductive interconnect 30 may be utilized to electrically couple the conductive structure 12 with another conductive structure 32 which is elevationally offset from the conductive structure 12.

The interconnect 30 may be considered to comprise the first conductive material 24 configured as an upwardly-opening container shape 34, and to comprise the second conductive material 28 within an interior region 36 of the container shape 34.

The conductive interconnect 30 may be considered to comprise a horizontal width $W_3$ along the cross-section of FIG. 10. In some embodiments, the first conductive material 24 may comprise from about 2% to about 90% of the horizontal width $W_3$, from about 2% to about 40% of the horizontal width $W_3$, etc.

In some embodiments, the first and second conductive materials 24 and 28 of the interconnect 30 may primarily comprise a same metal as one another (with the term "primarily comprise" meaning that such metal is the major chemical component of the conductive materials 24 and 28). In some embodiments, the conductive materials 24 and 28 may comprise, consist essentially of, or consist of one or more of tungsten, cobalt and nickel.

The conductive materials 24 and 28 of the interconnect 30 may differ from one another in one or both of average grain size and contaminant concentration. In some embodiments, the materials 24 and 28 may additionally, or alternatively, differ from one another in crystallographic orientation.

In some embodiments, the average grain size of the first conductive material 24 (i.e., the conductive material formed by ALD) is greater than the average grain size of the second conductive material 28 (i.e., the conductive material formed by one or both of CVD and PVD). For instance, the average grain size of the first conductive material 24 may be within a range of from about the thickness ($T_1$) of the first conductive material to about six-times (6×) the thickness of the first conductive material, while the average grain size of the second conductive material is when a range of from about one-tenth (0.1×) of a thickness $T_2$ of the second conductive material to about the thickness of the second conductive material. In some embodiments, the average grain size of the first conductive material 24 may be within a range of from about 30 nm to about 200 nm, and the average grain size of the second conductive material 28 may be within a range of from about 5 nm to about 100 nm.

In some embodiments, the first and second conductive materials 24 and 28 may differ from one another in contaminant contamination, and the contaminant may include one or more of silicon (Si), boron (B) and halide. For instance, the contaminant may include fluorine (F). The second conductive material 28 (i.e., the conductive material formed utilizing CVD and/or PVD) may have a higher contaminant concentration than the first conductive material 24 (i.e., the conductive material formed utilizing ALD), and in some embodiments may have a higher concentration of fluorine than the first conductive material. For instance, the concentration of fluorine within the second conductive material 28 may be at least about ten-times (10×) greater than the fluorine concentration within the first conductive material 24. In some embodiments, the fluorine concentration within the second conductive material 28 may be within a range of from about 10× (ten-times) that of the first conductive material 24 to about 1000× (one-thousand-times) that of the first conductive material 24.

Figure 11:
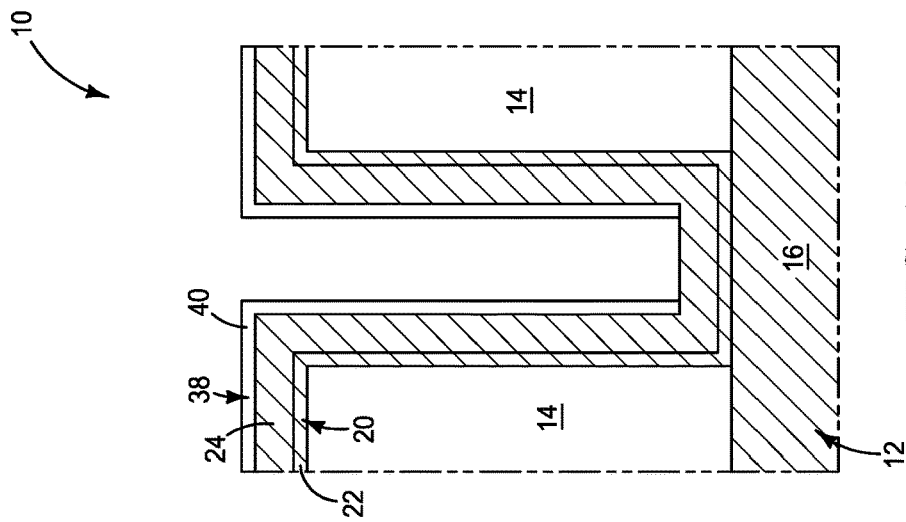
FIGS. 11-13 are diagrammatic cross-sectional side views of a region of an integrated assembly shown at sequential example process stages of an example method of forming an example structure. The process stage of FIG. 11 may follow that of FIG. 8.
Figure 12:
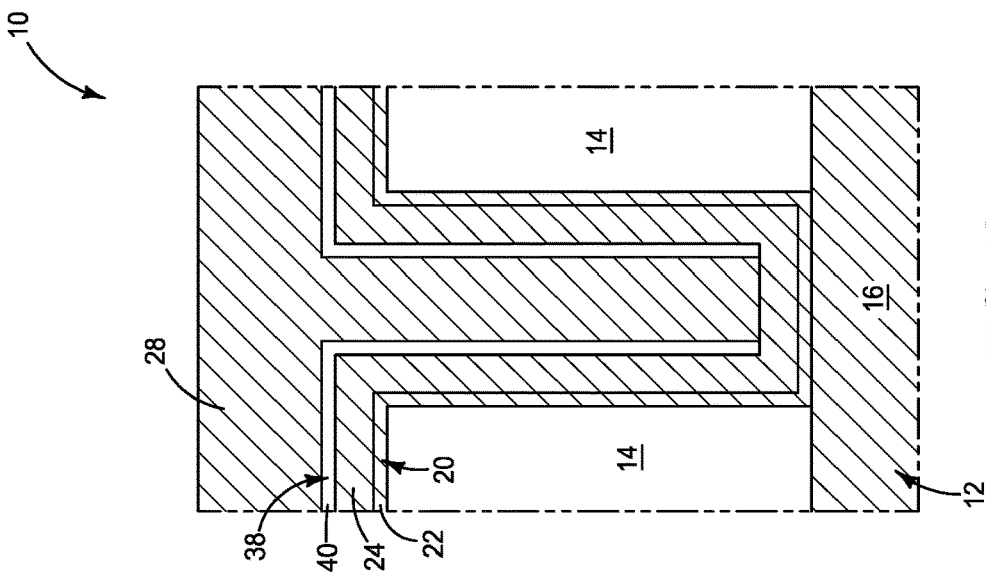
Figure 13:
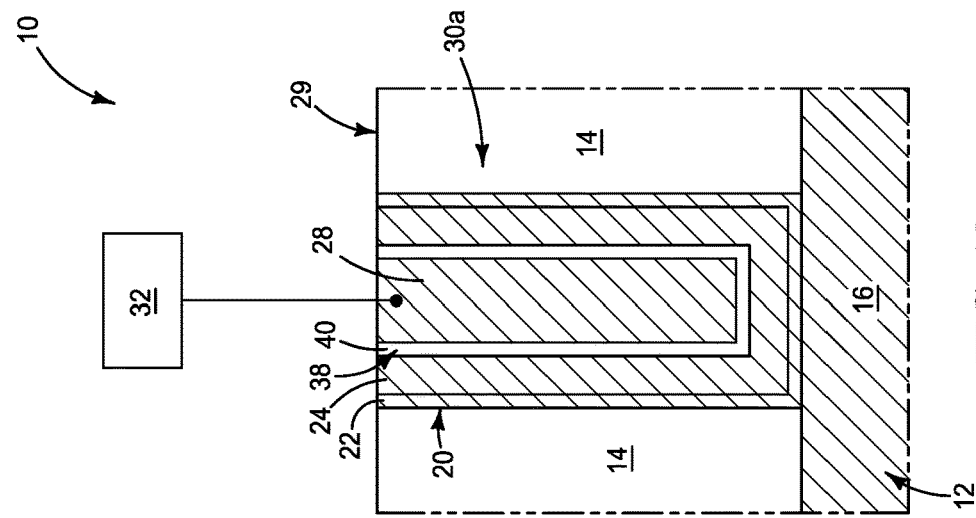

The embodiment of FIG. 10 shows the second conductive material 28 formed to be directly against the first conductive material 24. In other embodiments, a thin layer (liner) may be provided between the materials 24 and 28. The liner may be conductive, insulative, or semiconductive. FIGS. 11-13 describe an example embodiment in which a liner is formed between the materials 24 and 28.

Referring to FIG. 11, the assembly 10 is shown at a process stage which may follow that of FIG. 8. A liner 38 is formed over an upper surface of the conductive material 24. The liner 38 comprises a liner material 40. In some embodiments, the liner material 40 comprises an oxide formed by exposing the assembly 10 to air (and/or another source of oxygen). Accordingly, the liner material 40 may comprise an oxide which includes the same metal as the first conductive material 24. For instance, the liner material 40 may comprise one or more of tungsten oxide, cobalt oxide and nickel oxide. In some embodiments, the liner material 40 may be considered to comprise one or more of WO, CoO and NiO, where the chemical formulas indicate primary constituents rather than specific stoichiometries. The oxide-containing liner 38 may be referred to as an oxide-containing region.

In some embodiments, the liner material 40 may comprise a silicide formed by exposing the assembly 10 to a source of silicon. Accordingly, the liner material 40 may comprise a silicide which includes the same metal as the first conductive material 24. For instance, the liner material 40 may comprise one or more of tungsten silicide, cobalt silicide and nickel silicide. In some embodiments, the liner material 40 may be considered to comprise one or more of WSi, CoSi and NiSi, where the chemical formulas indicate primary constituents rather than specific stoichiometries. The silicide-containing liner 38 may be referred to as a silicide-containing region.

The liner material 40 may have any suitable thickness, and in some embodiments may have a thickness of less than or equal to about 10 nm. For instance, the liner material 40 may have a thickness within a range of from about 0.5 nm to about 10 nm.

Referring to FIG. 12, the second material 28 is formed over the liner 38. The second material 28 may be formed with CVD and/or PVD utilizing processing analogous to that described above with reference to FIG. 9.

Referring to FIG. 13, the planarized surface 29 is formed with processing (e.g., CMP) analogous to that described above with reference to FIG. 10. Accordingly, a conductive interconnect 30a is formed. The conductive interconnect 30a is analogous to the conductive interconnect 30 of FIG. 10, but differs from the conductive interconnect 30 in that the conductive interconnect 30a includes the liner 38. The liner material 40 may be electrically insulative without substantially impacting the overall conductivity of the conductive interconnect 30a if the liner material 40 is kept sufficiently thin.

Figure 14:
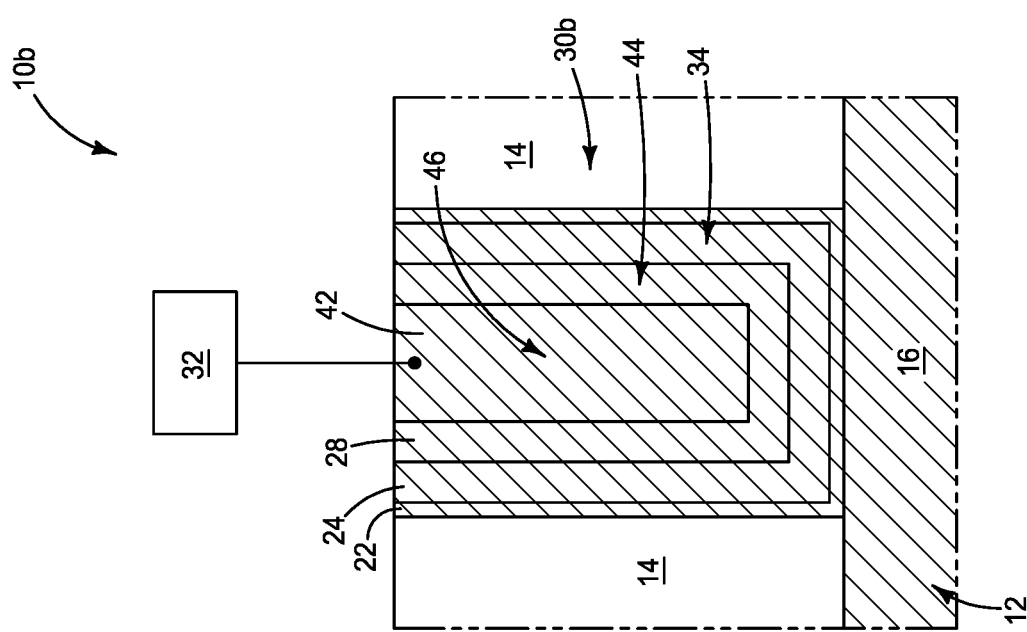

The embodiments of FIGS. 10 and 13 show conductive interconnects 30 and 30a which include a pair of conductive materials 24 and 28, with the conductive material 28 being nested within the conductive material 24. In other embodiments, analogous conductive interconnects may comprise more than two of the conductive materials. For instance, FIG. 14 shows a conductive interconnect 30b which is analogous to the conductive interconnect 30 of FIG. 10, but which includes a third conductive material 42 in addition to the first two conductive materials 24 and 28. In the shown embodiment, the second conductive material 28 is configured as a second container shape 44 which is nested within the first container shape 34. The second container shape 44 is configured as an upwardly-opening container shape, and the third conductive material 42 is within an interior cavity 46 of such upwardly-opening container shape.

The third conductive material 42 may be formed with one or both of CVD and PVD. The third conductive material 42 may comprise a same composition as the second conductive material 28, or may comprise a different composition relative to the second conductive material 28. The third conductive material 42 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

The third conductive material 42 may or may not be detectably distinguishable from the second conductive material 28.

Figure 15:
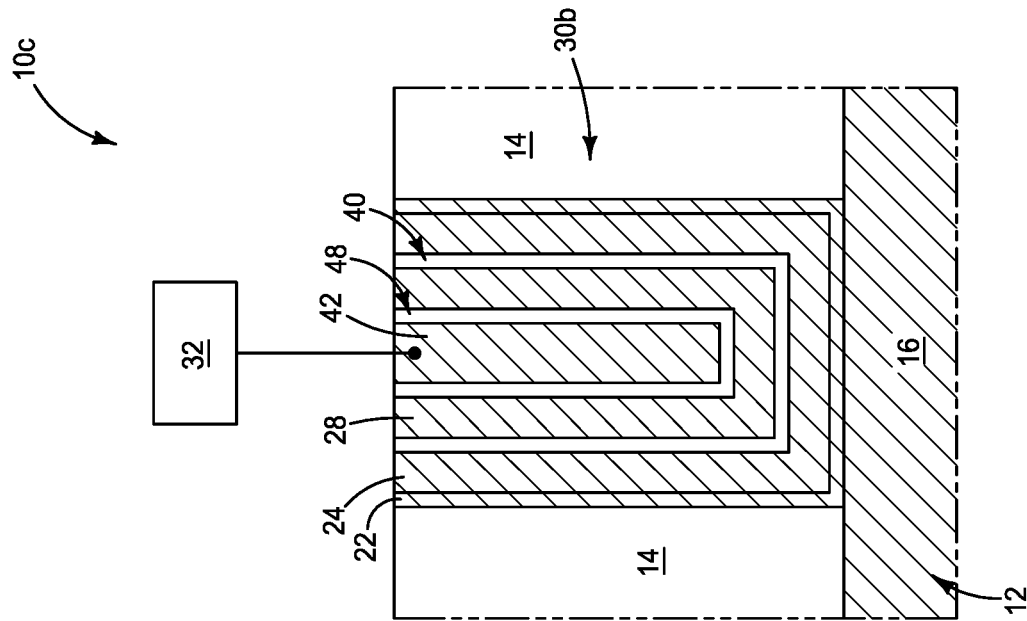
FIGS. 14-17 are diagrammatic cross-sectional side views of regions of example integrated assemblies showing example structures.

FIG. 15 shows an example conductive structure 30c which is analogous to the conductive structure 30a of FIG. 13, but which comprises an additional liner 48, with such liner being between the second conductive material 28 and the third conductive material 42. The liner 48 may comprise a same composition as the liner 40, or may comprise a different composition than the liner 40. In some embodiments, the first, second and third conductive materials 24, 28 and 42 may primarily comprise a same metal as one another. The first and second liners 40 and 48 may comprise a same composition as one another; with such composition including the same metal as the materials 24, 28 and 42, in combination with one or both of oxygen and silicon.

The interconnects 30-30c of FIGS. 10, 13, 14 and 15 may be incorporated into memory, logic, sensors, etc. For instance, such interconnects may be incorporated into NAND memory configurations.

Figure 16:
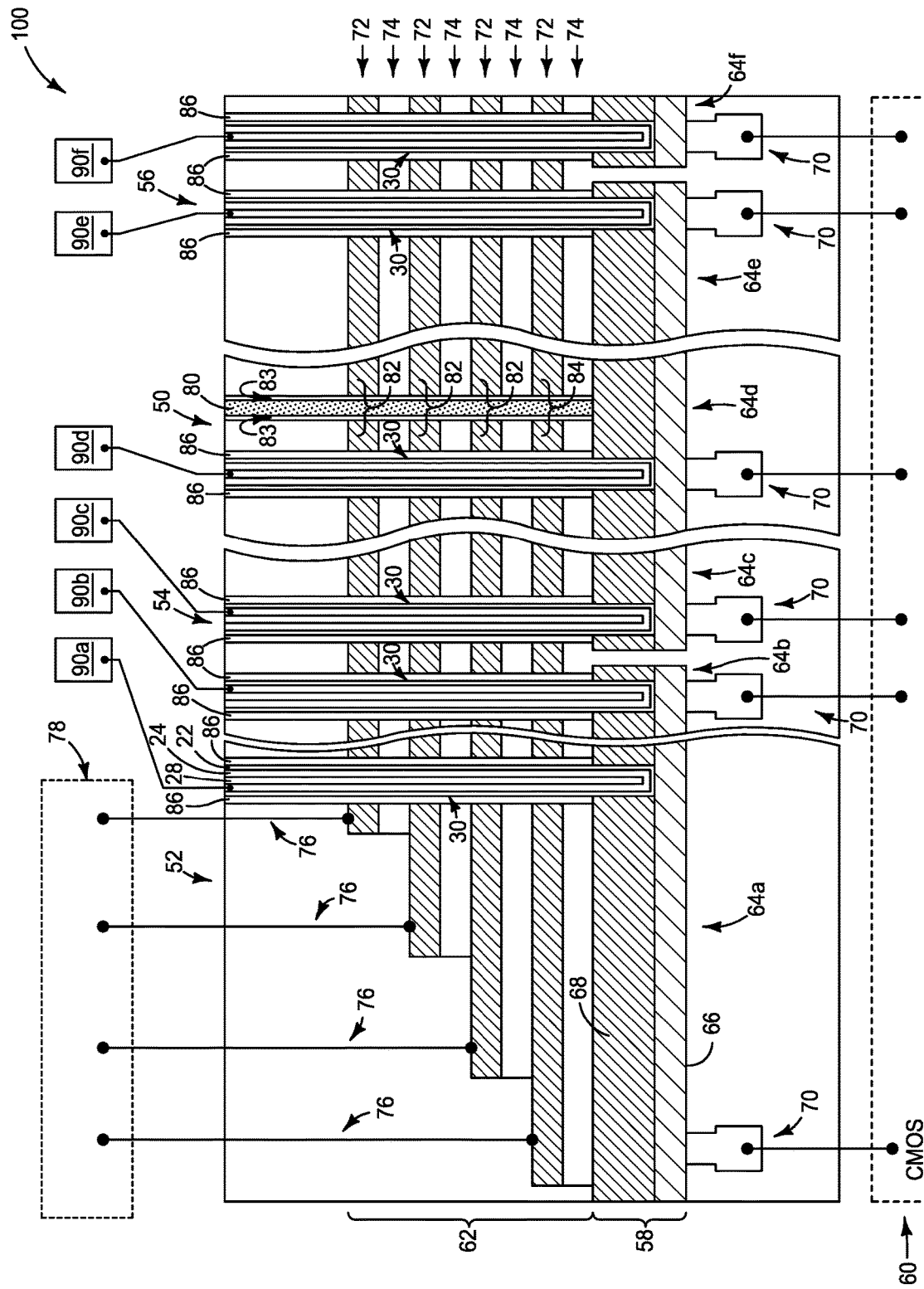

FIG. 16 shows an example integrated assembly 100 comprising a memory region 50, a staircase region 52, an intermediate region 54 between the staircase region 52 and the memory region 50, and a peripheral region 56 laterally offset from the memory region 50.

The assembly 100 includes a source level 58 over a logic circuitry level 60, and includes a memory stack level 62 over the source level 58.

In the illustrated embodiment, the logic circuitry level 60 includes CMOS. In other embodiments, the level 60 may include other suitable logic circuitry in addition to, or alternatively to, the CMOS.

The source level 58 includes conductive structures 64a-f. The conductive structure 64d corresponds to a source structure within the memory region 50 (with such source structure being analogous to, for example, the structures to 216 and 360 described above in the Background section). In the illustrated embodiment, the conductive structures 64a-f include two materials 66 and 68. The upper conductive material 68 may comprise conductively-doped semiconductor material (e.g., conductively-doped silicon), and the lower conductive material 66 may comprise metal-containing material (e.g., WSi, where the chemical formula indicates primary constituents rather than a specific stoichiometry). In other embodiments, the conductive structures 64a-64f may have other suitable configurations.

The conductive structures 64a-64f are electrically coupled with the CMOS circuitry of the level 60 through conductive interconnects 70. Such conductive interconnects may comprise any suitable configuration(s).

The memory stack level 62 includes a stack of alternating conductive levels 72 and insulative levels 74. The conductive levels 72 comprise wordlines of a memory array (e.g., wordlines analogous to those described above in the Background section). Such wordlines extend across the memory array within the memory region 50, and extend to interconnects 76 within the staircase region 52. The interconnects 76 couple the wordlines within the wordline levels 72 to appropriate circuitry 78. The circuitry 78 may include row decoder circuitry and/or wordline driver circuitry as described above in the Background section.

The stack within the memory stack level 62 may comprise any suitable number of conductive levels 72, such as, for example, 8 levels, 16 levels, 32 levels, 64 levels, 128 levels, 256 levels, etc.

In some embodiments, the conductive material of the levels 72 may be partially peripherally surrounded by high-k material (dielectric barrier material), which is not shown in FIG. 16 to simplify the drawing. The term "high-k" means a dielectric constant greater than that of silicon dioxide.

Channel material 80 is within the memory region 50. The channel material is configured as a vertically-extending pillar. Such pillar may be representative of a large number of channel-material-pillars formed within the memory region 50. For instance, there may be hundreds, millions, hundreds of millions, etc., of the channel-material-pillars.

Memory cells 82 are along the channel material 80, and comprise regions of the channel material 80 as well as regions of the conductive material of the wordline levels 72. Also, an SGS device 84 is shown to be along the bottommost conductive level 72, and to include a region of the channel material 80. SGD devices (not shown) may be along the channel material 80 and over the illustrated region of the memory stack level 62.

Regions 83 are shown along edges of the channel material 80. Such regions may include cell materials (e.g., charge-trapping material, charge-blocking material, gate dielectric material, etc.) which are incorporated into the memory cells 82 together with the channel material 80. Although the channel material 80 is shown as a solid pillar, in other embodiments the channel material may be configured as a hollow pillar which laterally surrounds an insulative material (e.g., silicon dioxide).

The memory cells 82 may be considered to be examples of NAND memory cells.

In the illustrated embodiment, interconnects 30 analogous to the interconnect 30 of FIG. 10 are formed to extend through the memory stack level 62 and into the conductive structures 64a-f along the source level 58. In the illustrated embodiment, the conductive interconnects 30 extend through the upper conductive material 68 of the source structures 64a-f and to an upper surface of the lower conductive material 66 of such source structures. In other embodiments the conductive interconnect 30 may extend to other suitable depths within the conductive source structures 64a-f, and may or may not all extend to the same depth as one another. In the illustrated embodiment, conductive interconnect 30 are formed within each of the regions 50, 52, 54 and 56 of the assembly 100. In other embodiments, one or more of the illustrated conductive interconnect 30 may be omitted. Cross-hatching is omitted from the conductive interconnects 30 of FIG. 16 to simplify the drawing.

The memory region 50 may comprise a memory array, and in some embodiments may comprise a NAND memory cells analogous to those described above in the Background section.

The conductive interconnects 30 are spaced from the conductive wordline material of the conductive levels 74 by intervening insulative material 86. The material 86 may comprise any suitable composition(s); such as, for example, one or both of silicon dioxide and silicon nitride.

The interconnects 30 may be utilized to couple the source structures 64a-f with circuitries 90a-f as shown. Two or more of the circuitries 90a-f may be the same as one another in some embodiments.

Figure 17:
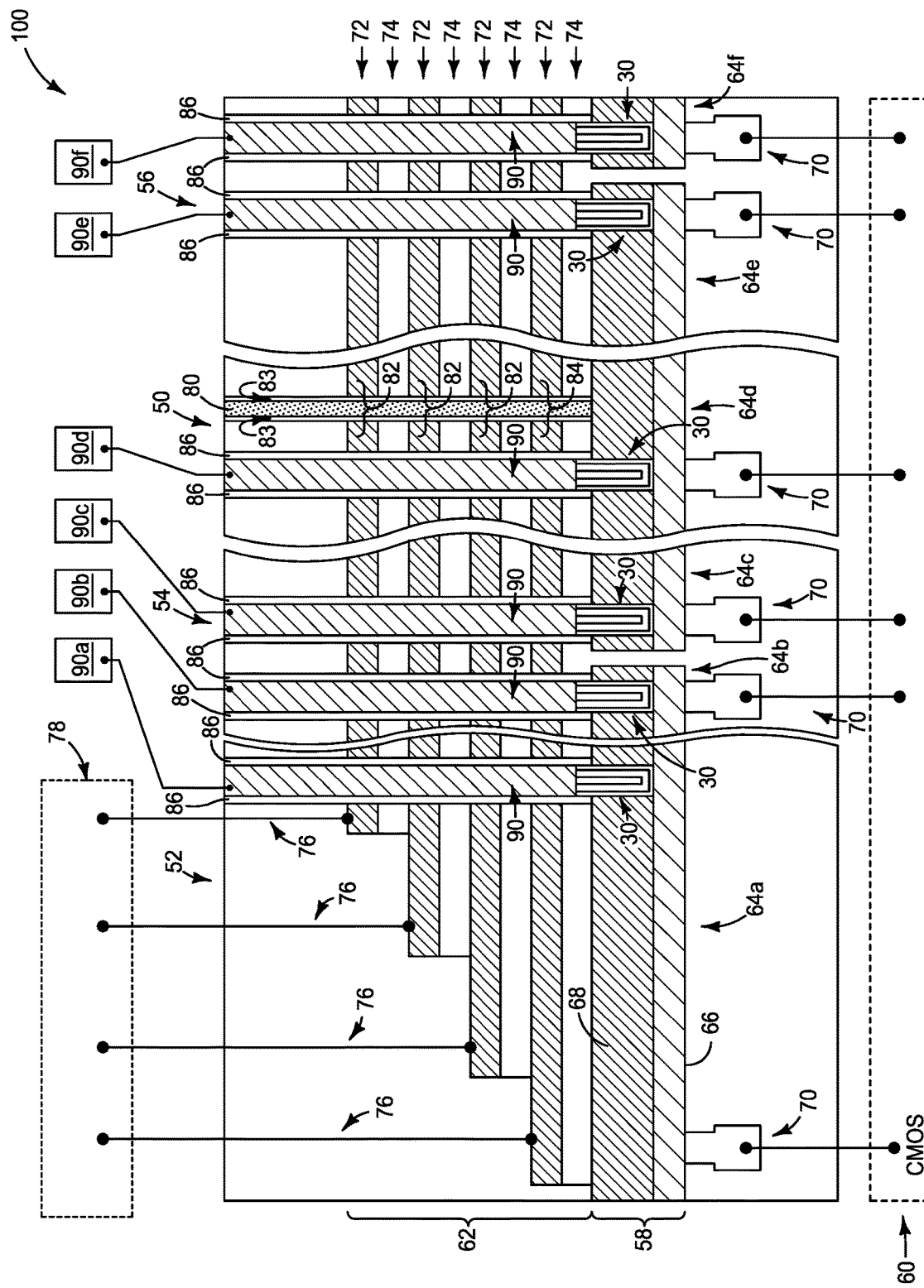

In some embodiments, the interconnects 30 may be shorter than those shown in FIG. 16. For instance, FIG. 17 shows the interconnects 30 extending into the source structures 64a-f, and being coupled with other interconnects 90 that extend through the memory stack level 62. The interconnects 90 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include a method of forming a conductive interconnect. An opening is formed to extend through an insulative material to a conductive structure. The opening has a pair of opposing sidewall peripheries along a cross-section, and has a bottom periphery extending between the sidewall peripheries. The bottom periphery is along the conductive structure. A liner material is formed along the sidewall peripheries and the bottom periphery of the opening to line the opening. A first conductive material is formed within the lined opening with ALD. The first conductive material narrows the lined opening. A cavity remains within the narrowed lined opening. A second conductive material is formed within the cavity with a second deposition method other than ALD. The conductive interconnect includes the first and second conductive materials and extends upwardly from the conductive structure.

Some embodiments include an integrated assembly having a conductive interconnect which extends upwardly from a conductive structure. The conductive interconnect includes a first conductive material configured as an upwardly-opening container shape, and includes a second conductive material within an interior region of the upwardly-opening container shape. The first and second conductive materials primarily comprise a same metal as one another and differ from one another in one or both of average grain size and contaminant concentration.

Some embodiments include an integrated assembly having a memory stack level over a source level. The memory stack level and the source level are laterally subdivided amongst a memory region, a staircase region, an intermediate region, and a peripheral region. NAND memory cells are within the memory region. Conductive structures are along the source level and within the memory region, the staircase region, the intermediate region and the peripheral region. The conductive structure within the memory region is a source structure. A logic circuitry level is under the source level and is electrically coupled to one or more of the conductive structures. One or more conductive interconnects extend upwardly from at least one of the conductive structures. At least one of said one or more of the conductive interconnects includes a first conductive material configured as an upwardly-opening container shape and includes a second conductive material within an interior region of the upwardly-opening container shape. The first and second conductive materials primarily comprise a same metal as one another and differ from one another in one or both of average grain size and contaminant concentration.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated assembly comprising a conductive interconnect extending upwardly from a conductive structure; the conductive interconnect including:
   a first conductive material configured as an upwardly-opening container shape having two inner sidewalls surfaces and a base surface extending between the two inner sidewall surfaces, the first conductive material comprising cobalt;
   a second conductive material within an interior region along the two inner sidewall surfaces and across the base surface of the upwardly-opening container shape; the first and second conductive materials each consisting of two or more of W, Co and Ni and primarily comprising a same metal as one another and differing from one another in average grain size, the second conductive material having a smaller average grain size relative to an average grain size of the first conductive material; and
a liner between the first conductive material and the second conductive material, the liner comprising metal silicide.

2. The integrated assembly of claim 1 wherein the upwardly-opening container shape of the first conductive material is a first upwardly-opening container shape; wherein the second conductive material is configured as a second upwardly-opening container shape; and wherein a third material is within an interior region of the second upwardly-opening container shape.

3. The integrated assembly of claim 2 wherein the liner is a first liner, and further comprising a second liner between the second and third conductive materials.

4. The integrated assembly of claim 3 wherein the third conductive material primarily comprises said same metal as the first and second conductive materials.

5. The integrated assembly of claim 1 wherein the conductive interconnect has a horizontal width along a cross-section corresponding to a maximum width of the upwardly-opening container shape, and wherein the first conductive material comprises from about 2% to about 90% of said horizontal width of the conductive interconnect.

6. The integrated assembly of claim 1 wherein the conductive interconnect has a horizontal width along a cross-section corresponding to a maximum width of the upwardly-opening container shape, and wherein the first conductive material comprises from about 2% to about 40% of said horizontal width of the conductive interconnect.

7. The integrated assembly of claim 1 wherein said same metal is tungsten.

8. The integrated assembly of claim 1 wherein:
the average grain size of the first conductive material is within a range of from about a thickness of the first conductive material to about 6× the thickness of the first conductive material; and
the average grain size of the second conductive material is within a range of from about 0.1× a thickness of the second conductive material to about the thickness of the second conductive material.

9. The integrated assembly of claim 1 wherein:
the average grain size of the first conductive material is within a range of from about 30 nm to about 200 nm; and
the average grain size of the second conductive material is within a range of from about 5 nm to about 100 nm.

10. The integrated assembly of claim 1 wherein the liner has a thickness of less than or equal to about 10 nm.

11. The integrated assembly of claim 1 wherein the liner has a thickness within a range of from about 0.5 nm to about 10 nm.

12. An integrated assembly, comprising:
a memory stack level over a source level; the memory stack level and source level being laterally subdivided amongst a memory region, a staircase region, an intermediate region, and a peripheral region; NAND memory cells being within the memory region;
conductive structures along the source level and within the memory region, the staircase region, the intermediate region and the peripheral region; the conductive structure within the memory region being a source structure;
a logic circuitry level under the source level and electrically coupled to one or more of the conductive structures; and
one or more conductive interconnects extending upwardly from at least one of the conductive structures; at least one of said one or more of the conductive interconnects including a first conductive material configured as an upwardly-opening container shape having a horizontally extending base surface extending between vertically extending between vertical sidewalls and including a second conductive material within an interior region of the upwardly-opening container shape, the second conductive material extending along the horizontal base surface and the vertical sidewalls and comprising cobalt and being spaced from the first conductive material by a liner comprising a metal silicide; the first and second conductive materials each consisting of two or more of W, Co and Ni and primarily comprising a same metal as one another and differing from one another in average grain size, the second conductive material having a smaller average grain size relative to the average grain size of the first conductive material.

13. The integrated assembly of claim 12 wherein said same metal is tungsten.

14. The integrated assembly of claim 12 wherein the liner further comprises metal oxide.

15. An integrated assembly comprising a conductive interconnect extending upwardly from a conductive structure; the conductive interconnect including:
a first conductive material configured as a first upwardly-opening container shape
a second conductive material configured as a second upwardly-opening container shape within an interior region of the upwardly-opening container shape; the first and second conductive materials each consisting of a metal component and a contaminant component, the metal component being one or more of W, Co and Ni; primarily comprising a same metal as one another and differing from one another in one or both of average grain size and contaminant concentration; and
a liner between the first conductive material and the second conductive material, the liner comprising one or both of nickel silicide and tungsten silicide and extending across interior sidewall and base surfaces of the first upwardly-opening container shape.

* * * * *